(12) United States Patent
Somasekhar et al.

(10) Patent No.: US 10,860,419 B2
(45) Date of Patent: Dec. 8, 2020

(54) MINIMAL ALIASING BIT-ERROR CORRECTION CODE

(71) Applicant: Intel Corporation, Santa Clara, CA (US)

(72) Inventors: Dinesh Somasekhar, Portland, OR (US); Wei Wu, Portland, OR (US); Shankar Ganesh Ramasubramanian, Hillsboro, OR (US); Vivek Kozhikkottu, Hillsboro, OR (US); Melin Dadual, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 16/236,151

(22) Filed: Dec. 28, 2018

(65) Prior Publication Data

US 2020/0210284 A1  Jul. 2, 2020

(51) Int. Cl.
G06F 11/10 (2006.01)
H03M 13/29 (2006.01)
G11C 29/52 (2006.01)

(52) U.S. Cl.
CPC .......... *G06F 11/1068* (2013.01); *G11C 29/52* (2013.01); *H03M 13/2906* (2013.01)

(58) Field of Classification Search
CPC . G06F 11/1068; G11C 29/52; H03M 13/2906
See application file for complete search history.

(56) References Cited

U.S. PATENT DOCUMENTS

| | | | |
|---|---|---|---|
| 2013/0151932 A1* | 6/2013 | Matuz | H03M 13/6541 714/776 |
| 2017/0315862 A1* | 11/2017 | Cideciyan | H03M 13/618 |
| 2018/0203761 A1* | 7/2018 | Halbert | G11C 29/52 |
| 2019/0007062 A1* | 1/2019 | Twitto | H03M 13/3707 |

* cited by examiner

*Primary Examiner* — Guy J Lamarre
(74) *Attorney, Agent, or Firm* — Fletcher Yoder, P.C.

(57) ABSTRACT

Systems and methods related to data encoders that can perform error detection or correction. The encoders and decoders may minimize the addition of errors due to aliasing in error correction codes by implementing operators associated with reduced aliasing parity generating or reduced aliasing error checking matrices.

20 Claims, 8 Drawing Sheets

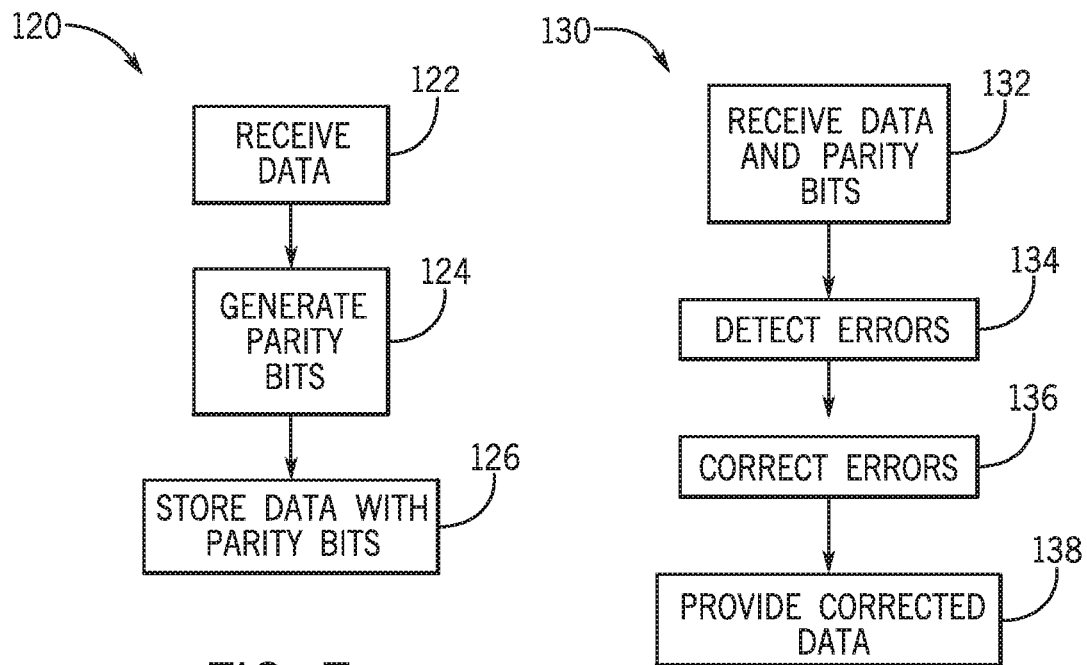
FIG. 7
FIG. 8
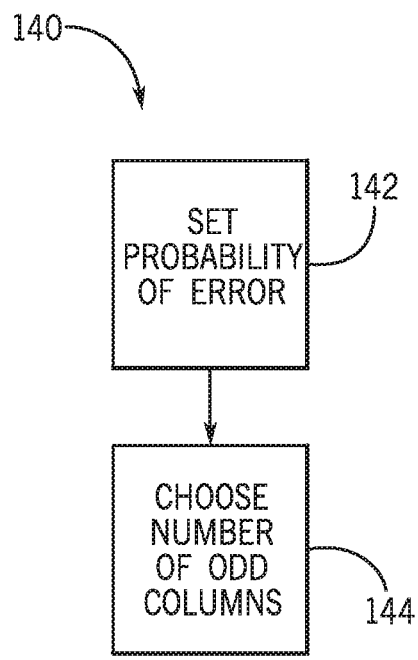
FIG. 9

MINIMAL ALIASING BIT-ERROR CORRECTION CODE

BACKGROUND

This disclosure relates to systems that use error correction codes (ECC) for communication or storage and, more specifically, to single error correction (SEC) codes with reduced probability of aliasing error.

This section is intended to introduce the reader to various aspects of art that may be related to various aspects of the present disclosure, which are described or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may transmit or store information by encoding that information in the form of binary data words. For example, data can be stored in a memory device as a sequence of binary words and can be transmitted over data communication lines as a serial stream of binary bits. Ordinarily, data corruption can take place during storage (e.g., due to faults in the memory device) or transmission, (e.g., due to a noisy channel). To mitigate data corruption, parity bits that add redundancy to the data can be used to allow verification or correction of data. The parity bits may be calculated and stored or transmitted, and the receiver may employ the parity bits to detect or correct any errors due in case data corruption occurred. The power of the data correction may, generally, be limited by the number of parity bits stored with the system. As a result, improvement in error detection or correction codes may be associated with an increase in the size of the storage memory or encoding or decoding circuitry.

BRIEF DESCRIPTION OF THE DRAWINGS

Various aspects of this disclosure may be better understood upon reading the following detailed description and upon reference to the drawings in which:

FIG. 7 is a method to generate codewords using the encoders described herein, in accordance with an embodiment;

FIG. 8 is a method to check or correct errors in codewords using the decoders described herein, in accordance with an embodiment;

FIG. 9 is a method to adjust the probability of aliasing errors for the encoders or decoders described herein, in accordance with an embodiment;

DETAILED DESCRIPTION OF SPECIFIC EMBODIMENTS

Figure 1:
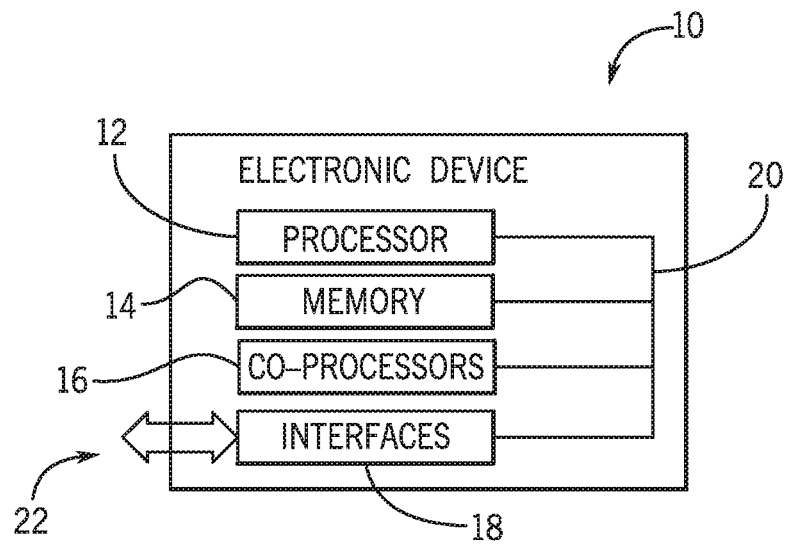
FIG. 1 is a block diagram of an electronic device that may benefit from the encoders and decoders that implement a reduced aliasing code, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Several electronic devices process information by encoding data using a binary alphabet. For example, user data, such as texts, images, sound samples, videos, as well as data structures such as machine-readable objects, databases, programming instructions, addresses, executable libraries, and the like, can be encoded in as an ordered group of binary words. These words may be stored in non-volatile memory (e.g., hard disks, solid-state disks, magnetic media, or compact discs) or in volatile media (random access memory (RAM) devices, dynamic random-access memory (DRAM) devices, or cache memory in the processor). These words may be transmitted over device-to-device connections, which may be wired, such as in universal serial bus (USB) connections, peripheral component express (PCIe) connections, and Ethernet connections, or wireless, such as in Bluetooth connections, cellular connections, or wireless Ethernet connections.

Corruption of the data may take place during storage or transmission. Random bit flip errors due to electromagnetic discharges or power source spikes may occur to volatile and to non-volatile data. Noise in the channels, due to external interference or signal degradation, may also cause bit flip errors. To mitigate faults due to data corruption, error correction codes (ECC) may be used. The ECC may employ parity bits that add redundancy to the stored or transmitted data. The redundancy from the parity bits allows detection or correction of errors due to the data corruption. For example, a receiver of the data may verify if the received parity bits correspond to the accompanying data to verify data integrity. Certain ECCs are designed to allow the receiver to identify the location of the corrupted bits correct the received data accordingly. As described herein, ECCs are inclusive of both error detection codes, in which the parity bits that allow identification of an error in a word, as well as error correction codes that allow identification of the location of an error in a word.

The power of an ECC may be defined as the number of corrupted bits per word that may be detected or corrected. Generally, the power of an ECC may be related to the number of parity bits per word. For example, an ECC may be capable of correcting up to 1 bit per word (single error correction (SEC) code), correcting up to 2 bits per word (dual error correction (DEC) code), detecting up to 1-bit error per word (single error detection (SED) code), or detecting up to 2-bit errors per word (dual error detection (DED) code). When an error exceeds the power of the ECC, errors may go undetected or additional errors, or aliasing errors, may be incorporated. For example, in a SEC code, a corruption to two or more bits may go undetected, as there may be two words in the SEC code that share common parity bits (e.g., silent corruption). Moreover, in some situations, a corruption of two or more bits in a SEC code may cause misidentification of the location of the corruption, causing an introduction of additional errors (e.g., aliasing errors) by the error correction logic of the decoder. When aliasing occurs to a codeword of an SEC code, a word with 2-bit errors may become a word with 3-bit errors due to a correction attempt by the receiver.

Increases in the number of parity bits generally improve the power of a code. For example, an SEC code for 128-bit words may employ 8 parity bits, whereas a single-error correction double error detection (SEC-DED) code for 128-bit words may employ 9 parity bits. However, the addition of parity bits may lead to increases in the amount of data to be stored or transmitted, or to an increase in the electrical power associated with the higher demand of circuitry resources. The present application is directed to electronic systems, and methods of operation thereof, that present an improved ECC performance by the use of novel encoders and decoders, without an increase in the number of parity bits and, thus, without an increased demand for circuitry resources. Specifically, the encoders or decoders described herein are designed to use a class of SEC codes that can prevent or decrease the probability of aliasing errors. To that end, certain constraints in the encoder or decoder circuitry, which may be associated with the class of SEC codes, may be employed. The class of SEC codes associated with the encoders or decoders described herein may provide a reduced or a minimal amount of aliasing errors for a particular number of word lengths or parity bits. In some embodiments, the encoders or decoders may be adjusted to control the aliasing rate by relaxing certain constraints in the SEC codes, as further discussed below.

With the foregoing in mind, FIG. 1 illustrates systems that may benefit or be improved by the use of the encoders or decoders described herein. FIG. 1 illustrates an electronic device 10 that may include be a digital computing system, or a digital data processing system. The electronic device 10 may be a computer system, a mobile phone, a wearable device, a network attached device, a data processing system, a data server, a media device, or any other computing device. The electronic device 10 may perform functionalities including but not limited to electronic gaming, data storage, database management, graphics processing, network management, sound editing, video editing, signal processing, sensor data processing, control, machine learning, artificial intelligence, or for serving internet and mobile applications.

The electronic device 10 may include a processor 12, which may perform computations with data. The processor 12 may include one or more general purpose processors and may include complex instruction-set processors (e.g., the Intel® Atom® processor, the Intel® Core® processor, or the Intel® Xeon® processor) or reduced-instruction-set processors (e.g., an Advanced RISC Machine (ARM) processor). Processor 12 may be communicatively coupled to a memory 14, which may be an on-die cache memory (e.g., a cache memory on the same day as the processor 12), an off-chip cache memory, a random access memory (RAM) device (e.g., a dynamic RAM (DRAM) device, a synchronous DRAM (SDRAM) device, a double-data rate SDRAM (DDR SDRAM) device), a low-power DDR device (LPDDR), a graphics DDR device (GDDR) device).

The processor 12 may also be assisted by one or more co-processors 16, which may be dedicated data processing circuitry that implementing application-specific functionalities. Co-processors 16 may perform, for example, graphics processing functions, network data processing functions, mathematical functions, vector computation functions, sound processing functions, digital signal processing, data filtering, machine learning, artificial intelligence decision making, or database management functions. In some embodiments, a co-processor 16 may implement ECC circuitry that implements encoders or decoders that perform the error detection or correction functionalities described herein. Co-processors 16 may be application-specific integrated circuits (ASICs) or reconfigurable programmable logic devices (PLDs) such as field programmable gate arrays (FPGAs). The co-processor 16 may access the memory 14 directly to perform its functions and may be controlled by the processor 12.

The electronic device 10 may include interfaces 18 to exchange data with other devices, such as long-term storage devices (e.g., hard drive disks, optical storage systems, magnetic storage systems, solid state drives), network devices (e.g., an Ethernet adaptor, a Wi-Fi adaptor), peripheral interfaces (e.g., universal serial bus (USB), Bluetooth, peripheral component interface express (PCIe)) that may be used to connect to input devices (e.g., keyboard, touchscreen, mouse) or display devices (e.g., display monitor, sound speakers). The interfaces may include external connections 22 that may provide access to devices external to the electronic device 10, such as access to a second electronic device via a network interface. The methods and systems described herein to incorporate error correction coding to data may be used in any of the data exchanges 20 between the processor 12, the memory 14, co-processors 16, or interfaces 18.

Figure 2:
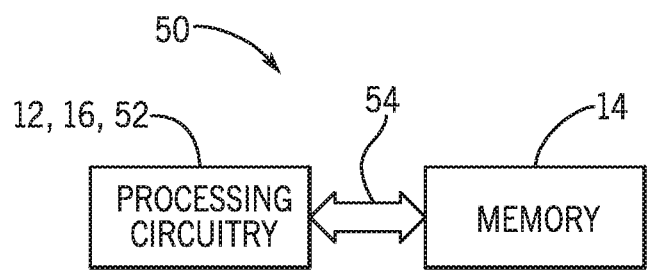
FIG. 2 is a block diagram of a data exchanges that may employ a reduced aliasing code, in accordance with an embodiment.

The diagram 50 of FIG. 2 illustrates an electronic system that may employ ECC systems to improve the operational its performance. The diagram 50 illustrates a processing circuitry 52 (e.g., processor 12 or co-processor 16) that exchanges data 54 with memory 14. For example, data 54 may contain instructions that are executed by the processing circuitry 52, such as a program stored in memory 14. The data 54 may also contain sections of the working memory or of information that is processed by the processing circuitry 52. In such systems, corruption of data 54 in the memory 14 or during transmission between memory 14 and processing circuitry 52 may lead to faulty performance of the electronic device. To mitigate errors due to data corruption, data 54 may be encoded using an SEC code, such as the ones described herein. To that end, ECC circuitry that can decode the SEC code may allow the processing circuitry 52 to detect errors, which may prevent faulty operation. Moreover, the above-mentioned ECC code may allow the processing circuitry 52 to correct errors, which may increase the efficiency of operation. In some embodiments, circuitry associated with the ECC systems may be located in the memory 14. For example, the memory 14 may have ECC circuitry that encodes the received data 54 prior to storage in the memory 14. The memory 14 may also have ECC circuitry that verifies integrity of stored data prior to transmission (e.g., data 54) to the processing circuitry 52. While the present discussion relates to data 54 exchanged between processing circuitry 52 and memory 14, the SEC codes discussed herein may be used with any type of data exchanges, as discussed above.

Figure 3:
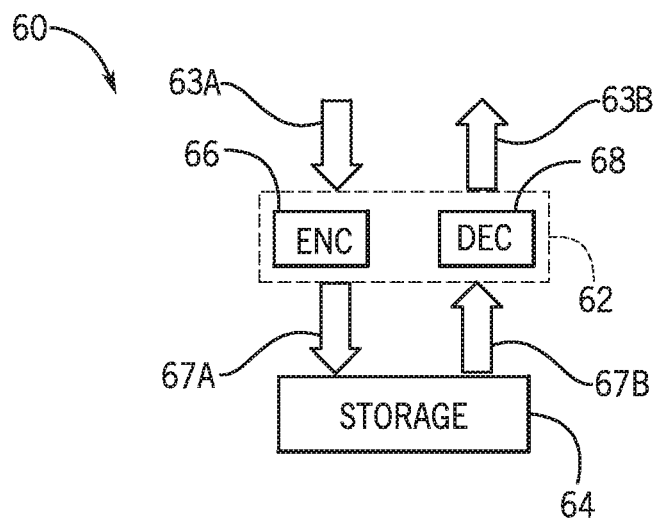
FIG. 3 is a block diagram of an encoder/decoder system that may be used to generate codewords using a reduced aliasing single-error correction (SEC) code and to check or correct errors in codewords using the SEC code, in accordance with an embodiment.

Diagram 60 of FIG. 3 illustrates an encoder/decoder circuitry 62 that implements the SEC codes discussed herein. The encoder/decoder circuitry 62 can be disposed in processing circuitry 50 (e.g., processor 12, co-processor 16), in the memory 14, or in both. In some embodiments, the encoder/decoder circuitry 62 may be located in an interface 18 to provide integrity to data transmitted through a communications connection. The encoder/decoder circuitry 62 can be used to provide reliability to stored and/or transmitted data words. The encoder/decoder circuitry 62 includes an encoder 66, which receives non-encoded data words 63A and generates codewords 67A. Codewords 67A may be generated by concatenating non-encoded data words 63A to parity bits calculated by the encoder 66. The encoder/decoder circuitry 62 also includes a decoder 68, which receives codewords 67B from the storage 64 and generates corrected words 63B to be provided by the data processing circuitry. Corrected words 63B may be generated by verifying if the codewords 67B are in accordance with the SEC code. To that end, the decoder 68 calculates a syndrome vector from the codeword 67B to determine the presence or location of a single bit error. The syndrome vector, which is calculated in accordance with the SEC code in the decoder 68, may be a zero vector (e.g., all terms of the syndrome are equal to zero) when no errors are present. A presence of a single "1" bit in the syndrome vector indicates a presence of a single bit error, and the position of the single "1" bit may correspond to the position of the bit error in the codeword 67B. The decoder 68 may use this information to correct (e.g., flip) the detected bit error. Moreover, the decoder 68 may determine that the corruption exceeds the error correction capacity of the SEC code, when the syndrome vector includes two or more "1" bits. In such situation the decoder 68 may report the data as non-usable, by dropping the word. In some embodiments, the reporting may be performed by generating a word 63B that contains a corrupted data flag.

Figure 4:
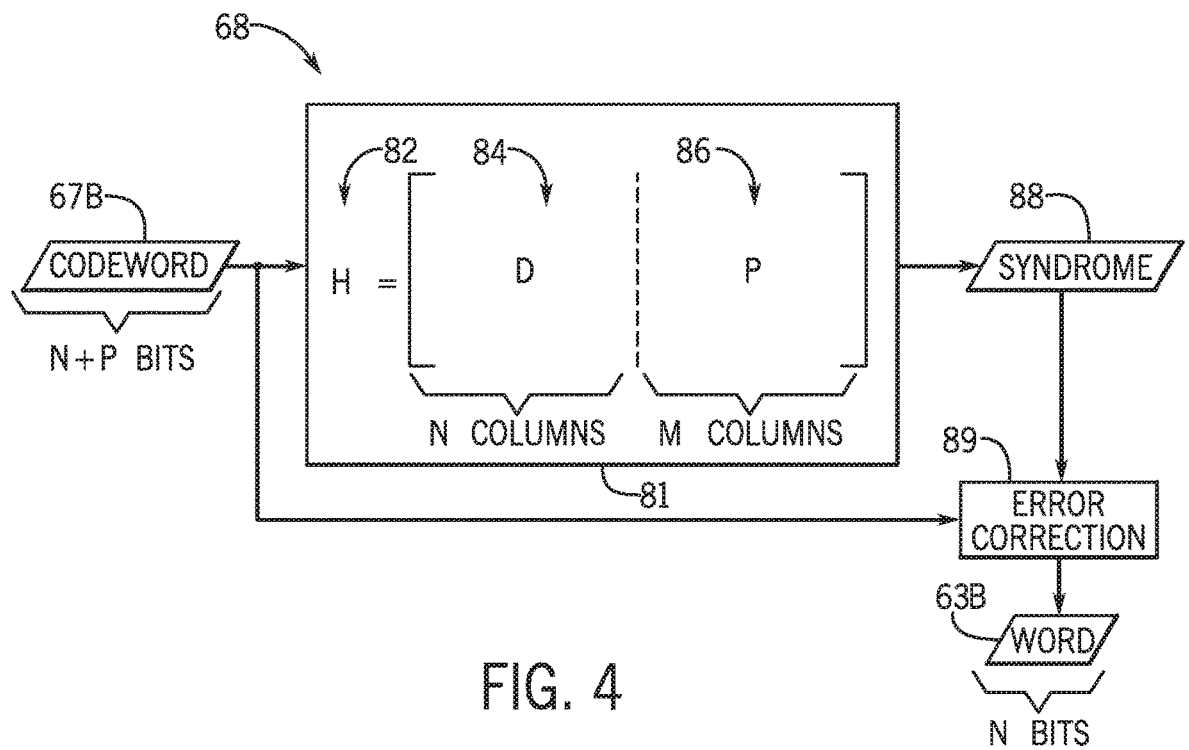
FIG. 4 is a block diagram of a reduced aliasing decoder that may employ a reduced aliasing SEC code, in accordance with an embodiment.

FIG. 4 illustrates an implementation of the decoder 68. The decoder 68 may include a syndrome calculation logic circuitry 81. The syndrome calculation logic circuitry 81 may include logic that implements an error checking operator (e.g., the H-matrix 82). The H-matrix 82 may be a linear operator in a Galois Field with size two (GF2). The H-matrix 82 may be represented as a binary array and/or as a logic circuit. An implementation in logic circuitry of the H-matrix 82 may be obtained, by converting the operations described in the binary array to logic operations (e.g., converting GF2 additions to XOR operations and converting GF2 multiplications to AND operations). It should be understood that other logic representations of the H-matrix 82 are possible. The syndrome calculation logic circuitry 81, thus, includes logic circuitry that implements the H-matrix 82 (i.e., logic circuitry that performs operations described by the H-matrix 82). The binary representation of the H-matrix 82 may be formed by the concatenation of the D-matrix 84, which may correspond to the data segment, with the P-matrix 86, which may correspond to the parity segment. The D-matrix 84 may have N columns and M rows, and the P-matrix 86 may have M columns and M rows. As a result, the H-matrix 82 describes an operator that may take codewords 67B with N+M bits and provide generate a syndrome 88 of length M.

The decoder 68 may also include an error correction block 89. The error correction block 89 may correct any corruption in the codeword 67B that is detected by the syndrome calculation logic circuitry 81. The error information may be included in the syndrome 88, generated as a result. For example, a syndrome 88 equal to a zero vector may indicate that no corruption occurred. A syndrome 88 with a single "1" bit may indicate the address in the data segment of the codeword 67B (e.g., the initial N bits) that contains the corrupted information. As the codeword 67B is a binary codeword, the bit of the codeword 67B addressed by the syndrome 88 may be corrected by flipping that bit. The error correction block 89 may, thus, correct the codeword 67B to produce the corrected word 63B.

In order to implement the reduced aliasing code discussed herein, certain constraints in the D-matrix 84 and in the P-matrix 86 are imposed. As such, the SEC codes employed by the encoder and decoders described herein may be described in terms of the associated H-matrix 82. In order to understand the construction of the SEC code, consider the example of an H-matrix 82 designed to operate on 128-bit words (i.e., N=128). An SEC code for such system should have M=8 bits, since M>log N+1. Other examples of codes that may be used include SEC codes having 256-bit words and 9 parity bits, or 64-bit words with 7 parity bits. Accordingly, the binary matrix associated with the H-matrix 82 may have 136 columns and 8 rows. The corresponding P-matrix 86 may have dimension 8×8 and the D-matrix 84 may have dimension 8×128. As each column has 8 elements, and each element can be either "0" or "1," each column of the binary matrix representation of the H-matrix 82 is taken from a total of 255 possible columns, since the number of permutations of 8-bit vectors excluding the zero vector is $8^2-1=255$. Moreover, in the construction of the H-matrix 82, all columns of its matrix representation should be distinct, to be compatible with a proper SEC code. Thus, from the 255 possible columns from which to pick the 136 columns that form the H-matrix 82, 128 columns have odd weight (i.e., the sum of elements in GF2 is 1) and 127 columns have even weight (i.e., the sum of elements in GF2 is 0). As discussed herein, odd-weight columns are columns in which the sum of elements in GF2 is 1 and even-weight columns are columns in which the sum of elements in GF2 is 0. A minimum-aliasing H-matrix 82, represented herein as $H_{opt}$, may be generated by assigning all possible 128 odd-weight columns to the D-matrix 84 and choosing 8 even-weight columns to form the P-matrix 86, as illustrated below.

$$H_{opt} = \begin{bmatrix} D & | & P \\ 128 \text{ Odd data columns} & | & 8 \text{ Even columns} \end{bmatrix}$$

Such an array may be free from aliasing errors (i.e., 2-bit errors in the codeword do not become 3-bit errors in the word portion of the codeword during the SEC decoding process). For example, consider a codeword 67B represented by C=[W|Y], in which W is the word of length 128 and Y is the parity segment with length 8. The syndrome 88 may be calculated as $S=HC^T$. As discussed above, the representation of the H-matrix 82 operator in matrix form H is associated with an SEC code and, thus, any single error event can be corrected by inspection of S. When one considers the situation in which codeword C includes two errors, notice that only three possibilities can occur: (i) two errors in the word W, (ii) two errors in the parity segment Y, or one error in the word W and one error in the parity segment Y. As the D-matrix 84 only includes even columns, in situation (i), the presence of two errors in W, the double errors would not alias to a data column, and thus, no toggle in the word would be induced by a correction based on syndrome S. In situation (ii), the presence of two errors in Y would involve the addition of two even parity columns, which would lead to even parity syndrome S and not result in any additional corruption in the data. In situation (iii), the presence of a single error in W and a single error in Y would lead to an even/odd combination, which would not alias to a data column. Therefore, for a potential SEC code decoded by $H_{opt}$, any 2-bit error would not be aliased by a decoder into a 3-bit error in the data segment. As a result, the number of corrupted bits in the data segment will be, at most, 2. Accordingly, the minimum H-matrix 84 ($H_{opt}$) may, without an increase in the number of parity bits M, prevent any three-error data corruption from being caused by aliasing from a double-error corruption event in the SEC codeword.

The use of a code compatible with the $H_{opt}$ may be limited in practical applications, since a P-matrix 86 with only even columns is generally non-invertible and an SEC encoder may include circuitry that implements operations associated with the inverse of the P-matrix 86 in its computation. In order to create a practical H-matrix 84, a column in the P-matrix 86 may be replaced with an odd-weight column. Moreover, as there may be only 128 odd-weight columns available, as discussed above, one column of the D-matrix 84 may be swapped with a P-matrix 86. An example of the construction of the H column is described below. Consider the following H-matrix 84 with the following P-matrix 86 and the D-matrix 84 with 128 odd columns.

$$H_{opt} = \begin{bmatrix} 1 & & & 1 & 1 & 0 & 0 & 0 & 0 & 0 & 0 \\ 0 & & & 0 & 1 & 1 & 0 & 0 & 0 & 0 & 0 \\ 0 & & & 0 & 0 & 1 & 1 & 0 & 0 & 0 & 0 \\ 0 & \cdots & & 0 & 0 & 0 & 1 & 1 & 0 & 0 & 0 \\ 0 & 127 \text{ odd columns} & | & 0 & 0 & 0 & 0 & 1 & 1 & 0 & 0 \\ 0 & & & 0 & 0 & 0 & 0 & 0 & 1 & 1 & 0 \\ 0 & & & 0 & 0 & 0 & 0 & 0 & 0 & 1 & 1 \\ 0 & & & 1 & 0 & 0 & 0 & 0 & 0 & 0 & 1 \end{bmatrix}$$

In order to make the P-matrix 86 invertible, one may swap columns to add a single odd column to P-matrix 86, as illustrated below:

$$H_1 = \begin{bmatrix} 1 & & & 1 & 1 & 0 & 0 & 0 & 0 & 0 & 0 \\ 0 & & & 0 & 1 & 1 & 0 & 0 & 0 & 0 & 0 \\ 0 & & & 0 & 0 & 1 & 1 & 0 & 0 & 0 & 0 \\ 0 & \cdots & & 0 & 0 & 0 & 1 & 1 & 0 & 0 & 0 \\ 0 & 127 \text{ odd columns} & | & 0 & 0 & 0 & 0 & 1 & 1 & 0 & 0 \\ 0 & & & 0 & 0 & 0 & 0 & 0 & 1 & 1 & 0 \\ 0 & & & 0 & 0 & 0 & 0 & 0 & 0 & 1 & 1 \\ 1 & & & 0 & 0 & 0 & 0 & 0 & 0 & 0 & 1 \end{bmatrix}$$

This system may be slightly more susceptible to aliasing in the first bit, and that probability of aliasing may be calculated. There are $$\binom{136}{2} = 9180$$

combinations of double bit errors. The $H_1$ matrix above may have 189 combinations which results in three-bit errors (126 errors from single column aliasing and 63 combinations from multi-column aliasing that reverts to the first column), with a probability of aliasing or 189/9180=2.06%. Note that the probability of aliasing may be adjusted based on the number of even columns in the D-matrix 84. In the present disclosure, H-matrix 82 may be represented by $H_1$, $H_2, \ldots, H_k$, in which the index k corresponds to the number of odd columns in the P matrix. It should be understood that each $H_k$ corresponds to a class of matrices. In fact, $H_k$ may refer to any H-matrix for an SEC having N data bits and M parity bits, in which the D segment may have a number of odd-weight columns equal to N–k (e.g., N–1, N–2, etc.). Table 1 provides the probability of aliasing for SEC codes with 128 bits and 8 parity bits, based on the number of odd-weight columns.

| $H_k$ | Aliasing Probability |
|---|---|
| 2 | 4.57% |
| 3 | 6.78% |
| 4 | 8.94% |
| 5 | 11.05% |
| 6 | 13.11% |
| 7 | 15.13% |
| 8 | 17.09% |
| 9 | 19.01% |
| 10 | 20.88% |
| 11 | 22.70% |
| 12 | 24.47% |
| 13 | 26.19% |

-continued

| $H_k$ | Aliasing Probability |
| --- | --- |
| 14 | 27.86% |
| 15 | 29.49% |
| 16 | 31.06% |
| 17 | 32.59% |
| 18 | 34.07% |
| 19 | 35.49% |
| 20 | 36.87% |
| 21 | 38.21% |
| 22 | 39.49% |
| 23 | 40.72% |
| 24 | 41.90% |
| 25 | 43.04% |
| 26 | 44.13% |
| 27 | 45.16% |
| 28 | 46.15% |
| 29 | 47.09% |
| 30 | 47.99% |
| 31 | 48.83% |
| 32 | 49.62% |

Figure 5:
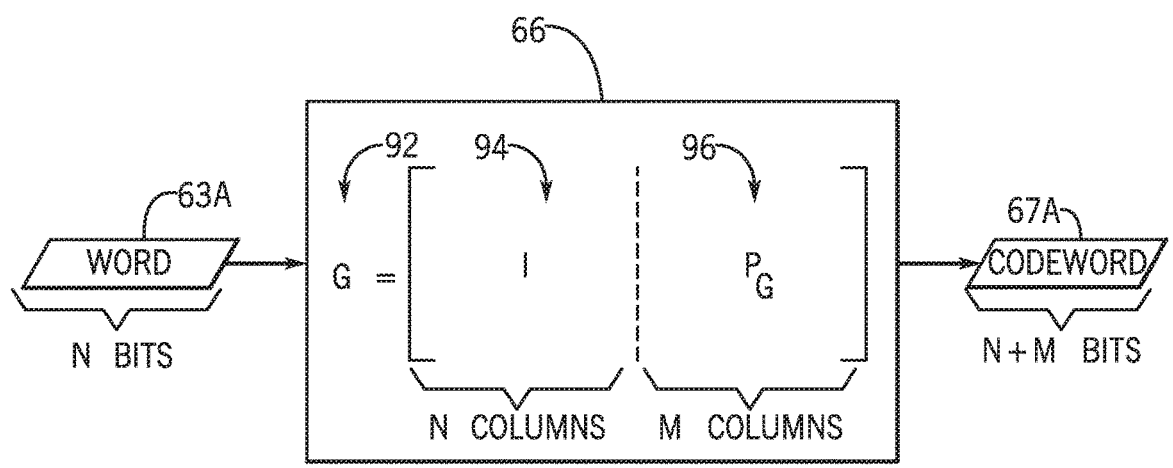
FIG. 5 is a block diagram of a reduced aliasing encoder that may employ a reduced aliasing SEC code, in accordance with an embodiment.

FIG. 5 illustrates an implementation of the encoder 66. The encoder 66 may include logic circuitry that is representative of an encoding operator, or G-matrix 92. The G-matrix 92 may be a linear operator that operates in a Galois Field with size two (GF2), in which an addition may be represented by a XOR operation and a multiplication may be represented by an AND operation. The encoder 66, thus, includes logic circuitry that performs the operations described by the G-matrix 92. The binary array representation of the G-matrix 92 may be formed by the concatenation of an N×N identity matrix I 94, corresponding to the data segment, and a parity generating $P_G$-matrix 96, corresponding to the parity segment. The $P_G$-matrix 96 may have M columns and N rows. Thus, for a word W of length M, the G-matrix 92 may generate the codeword C=GW=[W|Y], in which the parity bits may be calculated by Y=$P_G$ W. In some embodiments, the encoder 66 may include circuitry that performs the full array operation C=GW. In some embodiments, the encoder 66 may perform the operation Y=$P_G$ W followed by a concatenation with the word W to form C. In order to design the logic of the encoder 66 that corresponds to a decoder 68 associated with a H-matrix 82, a parity generating $P_G$-matrix 96 that corresponds to the binary array representation H=[D|P], can be calculated as $P_G=(P^{-1}D)^T$. The G-matrix 92 operator may, thus, be a concatenation of the identity matrix 94 with the parity generating $P_G$-matrix 96. From the resulting G-matrix 92, logic circuitry may be implemented to obtain the encoder 66.

Figure 6:
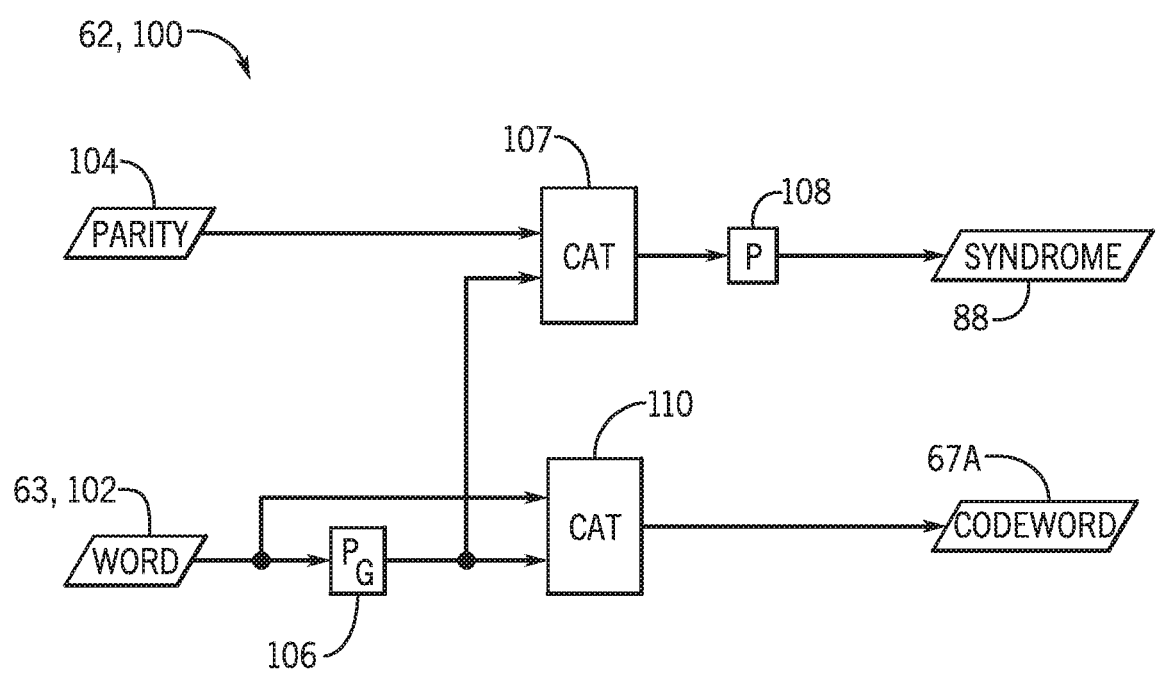
FIG. 6 is a block diagram of an integrated reduced aliasing encoder/decoder that may employ a reduced aliasing SEC code, in accordance with an embodiment.

In some embodiments, the encoder/decoder circuitry 62 may be employ shared circuitry, as illustrated in the diagram 100 of FIG. 6. Diagram 100 of FIG. 6 illustrate an encoder/decoder circuitry 62 that may be used to generate codeword 67A from a word 63, and to check the syndrome 88 from a codeword formed by word portion 102 and the parity portion 104. To that end, the encoder portion of the encoder/decoder circuitry 62 may be formed by the parity generating block 106 and the concatenation block 110, and the decoder portion of the encoder/decoder circuitry 62 may be formed by a parity generating block 106, the concatenation block 107, and a parity-check block 108.

For a given H-matrix 82 (e.g., $H_k$, as discussed above) that is formed by D-matrix 84 and P-matrix 86, the encoder portion of the encoder/decoder circuitry 62 may be performed by concatenating the word 63 (i.e., identity operator applied to the word as illustrated in the G-matrix 92 described above) with the result of the application of the parity generating matrix $P_G$ to the word 63. In the encoder/decoder circuitry 62 of FIG. 6, the concatenation is performed by the concatenation block 110. The concatenation block 110 receives the word 63 directly, as well as the parity bits calculated by parity generating block 106, which implements the linear operator represented by $P_G$. The result of the concatenation block 110 is a codeword 67A.

Moreover, as discussed above, $P_G=(P^{-1}D)^T$ and, thus, it follows from algebraic manipulation that D=P $P_G^T$. Thus, the calculation of a syndrome 88 from a codeword C=[W|Y] may be performed as by noting that S=$HC^T$=[D W|P Y]=P [$P_G^T$ W|Y]. As a result, the syndrome S may be calculated by applying the parity generating matrix $P_G$ to the word portion 102 of a codeword, concatenating the result with the parity portion 104 of the codeword, and applying the P-matrix 86 to the result. In the encoder/decoder circuitry 62 of FIG. 6, the codeword may be split into a word portion 102 and a parity portion 104. The word portion 102 may be processed by the parity generating block 106 and its result may be transmitted to concatenation block 107. The concatenation block 107 may also receive the parity portion 104 to form a message that may be checked by parity-check block 108. The result may be the syndrome 88. As the both the $P_G$-matrix 96 is N×M and the D-matrix 84 is M×N, the reutilization of the parity generating block 106 in both the encoder and the decoder may allow substantial reduction in the floorplan usage.

With the foregoing in mind, FIGS. 7, 8, and 9, illustrate methods to employ the encoder/decoder systems that implements the SEC codes with reduced aliasing probability, as described herein. FIG. 7 illustrates a method 120 to generate codewords with parity bits. In a first step, an encoder portion of the system receive words in process block 122. The encoder generates parity bits in process block 124. The SEC code employed by the encoder in process block 124 belong to a class having reduced aliasing probability. For example, the parity generating circuitry may be generated from a $P_G$ matrix (e.g., $P_G$ matrix 96) or a G matrix (e.g., G-matrix 92) that corresponds to a H-matrix 82 with a single even-weighted column in the data portion of its binary array representation, as discussed above. As a result, the codewords generated may be less likely to suffer from aliasing errors when more than a single error takes place. The words and the parity bits may be concatenated in process block 126 for resilient storage.

The FIG. 8 illustrates a method 130 to retrieve and correct codewords, or data stored with parity bits. In process block 132, the decoder may receive the codewords. In process block 134, the decoder may detect errors. Error detection may be performed by the calculation of a syndrome vector. In order to calculate the syndrome vector, the decoder may employ a H-matrix 82 having a single even-weighted column in the data portion of its binary array representation, as discussed above. As a result, of the use of the SEC code associated with the H-matrix 82, the probability of aliasing errors may be minimized, resulting in improved error detection and correction capacity. In a process block 136, the errors may be corrected in the bits indicated by the syndrome vector. For example, the syndrome vector may indicate the location of the bit errors and, in process block 136, the bits with errors may be flipped. In process block 138, the corrected word may be provided.

FIG. 9 illustrates a method 140 to configure the encoder/decoder system based on a probability of aliasing error. Method 140 may be performed in a synthesis software (e.g., an electronic synthesis software, electrical computer-aided design software), by a reprogrammable encoder/decoder circuitry (e.g., a soft-logic based encoder/decoder) and/or a customizable software encoder or decoder. As discussed above, the aliasing error may be determined based on the number of odd columns in the P-matrix 86. As a result, the encoder/decoder system may be user-configurable based on a tolerance to aliasing errors. In a process block 142, the synthesis software may receive a probability of aliasing error. Based on that choice, a number of odd columns may be automatically selected in process block 144. That selection may be calculated using a look-up table stored in the system or based on a combinatorial calculation performed by the configuration system. As a result of that selection, a synthesis software may design a logic circuit that implements an H-matrix and a G-matrix that implements the encoder/decoder system, as discussed above. The logic circuit may be implemented in programmable logic, encoded as a look-up table in configurable ECC circuitry, and/or implemented as a hardened logic module (e.g., an ASIC).

Figure 10:
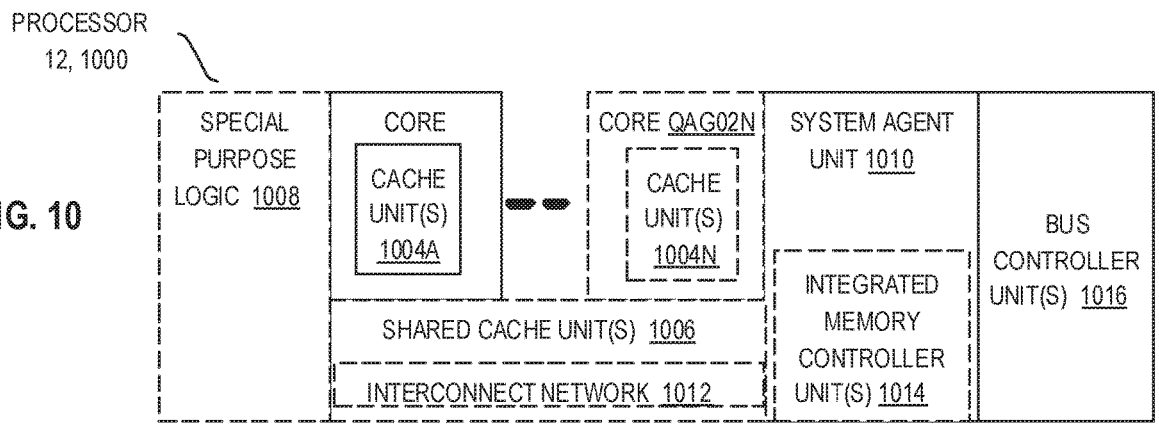
FIG. 10 is a block diagram of a processor that may have more than one core, may have an integrated memory controller, and may have integrated graphics, in accordance with an embodiment.

With the foregoing in mind, FIGS. 10-14 illustrate examples of systems that may employ the circuitry to encode and/or decode data using the SEC codes above described. FIG. 10 is a block diagram of a processor 1000 that may have more than one core, may have an integrated memory controller, and may have integrated graphics according to embodiments. The solid lined boxes in FIG. 10 illustrate a processor 1000 with a single core 1002A, a system agent 1010, a set of one or more bus controller units 1016, while the optional addition of the dashed lined boxes illustrates an alternative processor 1000 with multiple cores 1002A-N, a set of one or more integrated memory controller unit(s) 1014 in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1000 may be a part of and/or may be implemented on one or more substrates using any of a number of process technologies, such as, for example, BiCMOS, CMOS, or NMOS.

The memory hierarchy includes one or more levels of cache within the cores, a set of one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring-based interconnect unit 1012 interconnects the integrated graphics logic 1008 (e.g., a special purpose logic), the set of shared cache units 1006, and the system agent unit 1010/ integrated memory controller unit(s) 1014, alternative embodiments may use any number of well-known techniques for interconnecting such units. In one embodiment, coherency is maintained between one or more cache units 1006 and cores 1002-A-N.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture instruction set; that is, two or more of the cores 1002A-N may be capable of execution the same instruction set, while others may be capable of executing only a subset of that instruction set or a different instruction set.

FIGS. 11-14 are block diagrams of examples of computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 11:
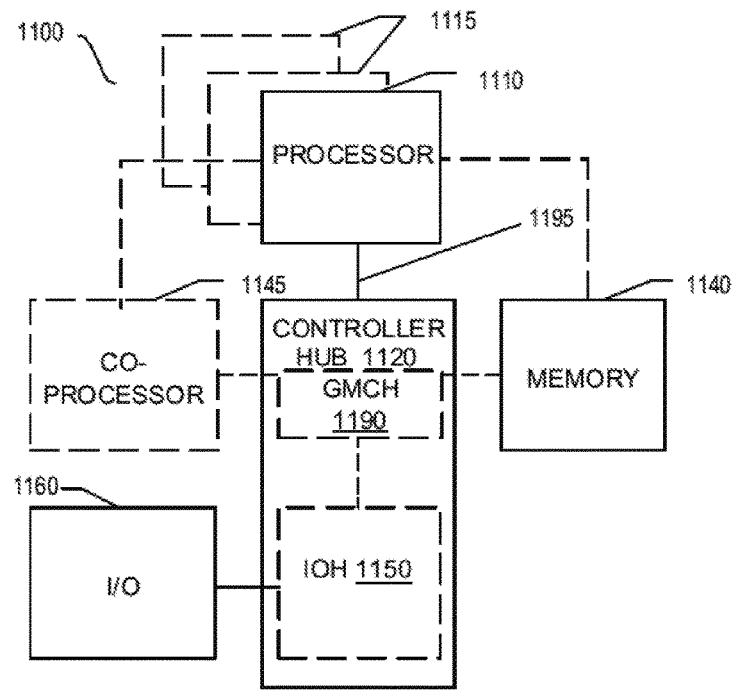
FIG. 11 is a block diagram of a system having processors coupled to a controller hub, in accordance with an embodiment.

Referring now to FIG. 11, shown is a block diagram of a system 1100 in accordance with one embodiment. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips); the GMCH 1190 includes memory and graphics controllers to which are coupled memory 1140 and a coprocessor 1145; the IOH 1150 couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 in a single chip with the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random-access memory (DRAM), phase change memory (PCM), or a combination of the two. For at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In one embodiment, the coprocessor 1145 is a special-purpose processor, such as, for example, a high-throughput MIC processor, a network or communication processor, compression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
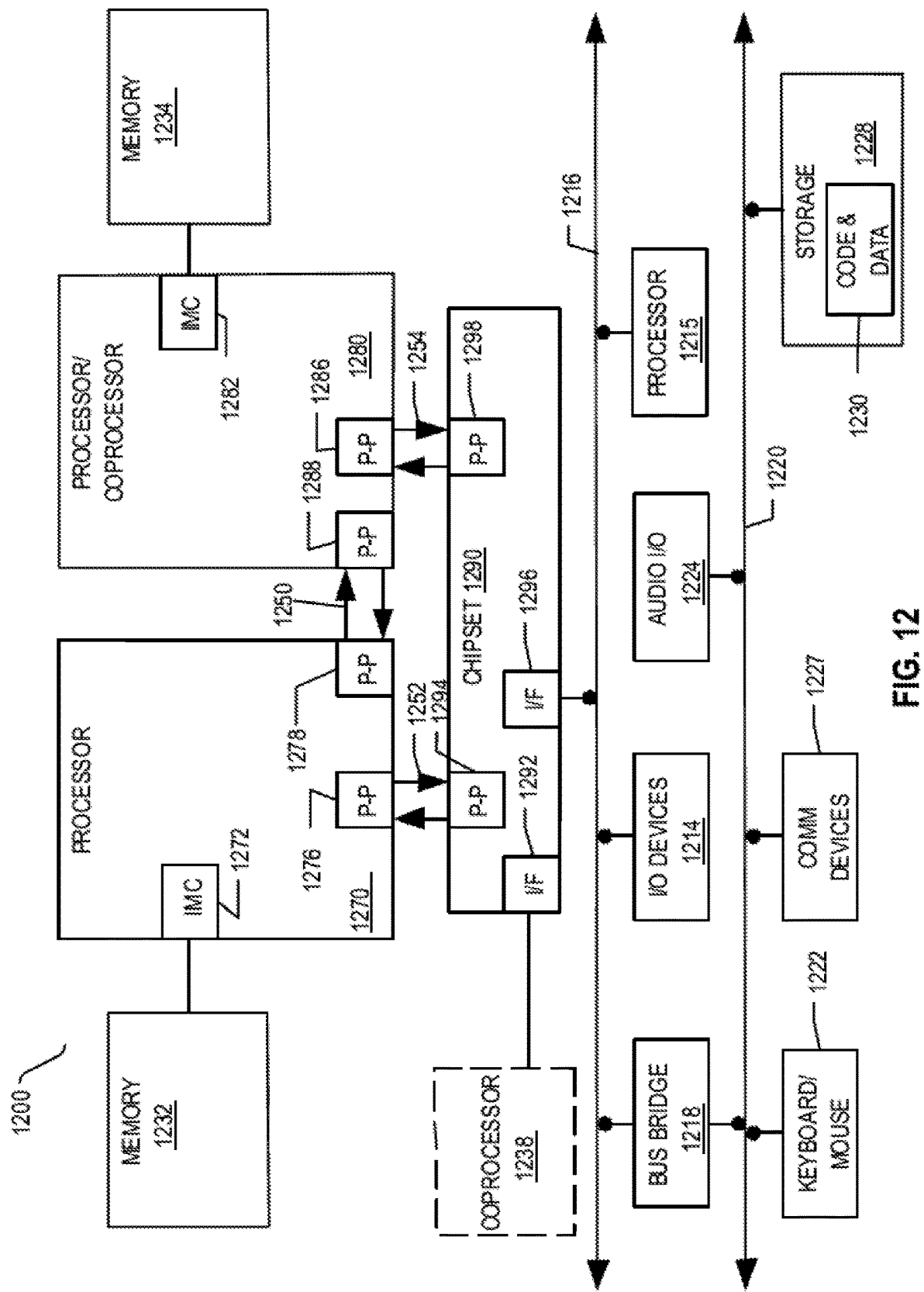
FIG. 12 is a block diagram of a multiprocessor system operating as a point-to-point interconnect system, in accordance with an embodiment.

Referring now to FIG. 12, shown is a block diagram of a first more specific examples of a system 1200 in accordance with an embodiment. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment, processors 1270 and 1280 are respectively processors 1110 and 1115, while coprocessor 1238 is coprocessor 1145. In another embodiment, processors 1270 and 1280 are respectively processor 1110 coprocessor 1145.

Processors 1270 and 1280 are shown including integrated memory controller (IMC) units 1272 and 1282, respectively. Processor 1270 also includes as part of its bus controller unit's point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors. Processors 1270, 1280 may each exchange information with a chipset 1290 via individual P-P interfaces 1252, 1254 using point-to-point interface circuits 1276, 1294, 1286, and 1298. Chipset 1290 may optionally exchange information with the coprocessor 1238 via a high-performance interface 1292. In one embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors yet connected with the processors via P-P interconnect, such that either or both processors' local cache information may be stored in the shared cache if a processor is placed into a low power mode. Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPUs, accelerators (such as, e.g., graphics accelerators or digital signal processing (DSP) units), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in one embodiment. Further, an audio I/O 1224 may be coupled to the second bus 1220. Note that other architectures are possible. For example, instead of the point-to-point architecture of FIG. 12, a system may implement a multi-drop bus or other such architecture.

Figure 13:
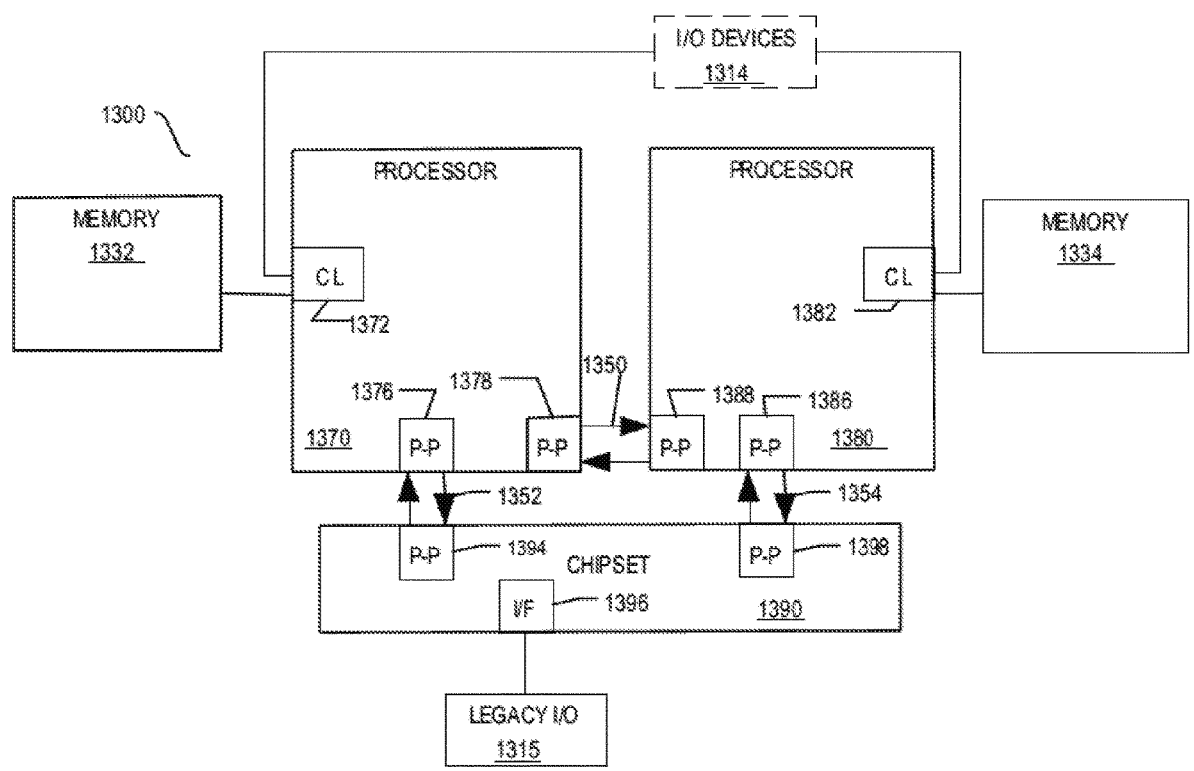
FIG. 13 is a block diagram of a multiprocessor system with integrated graphics, in accordance with an embodiment.

Referring now to FIG. 13, shown is a block diagram of a second example of a system 1300 in accordance with an embodiment of the present disclosure. Like elements in FIGS. 12 and 13 bear like reference numerals, and certain aspects of FIG. 12 have been omitted from FIG. 13 in order to avoid obscuring other aspects of FIG. 13. FIG. 13 illustrates that the processors 1270, 1280 may include integrated memory and I/O control logic ("CL") 1272 and 1282, respectively. Thus, CL 1272, 1282 may include integrated memory controller units and/or I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
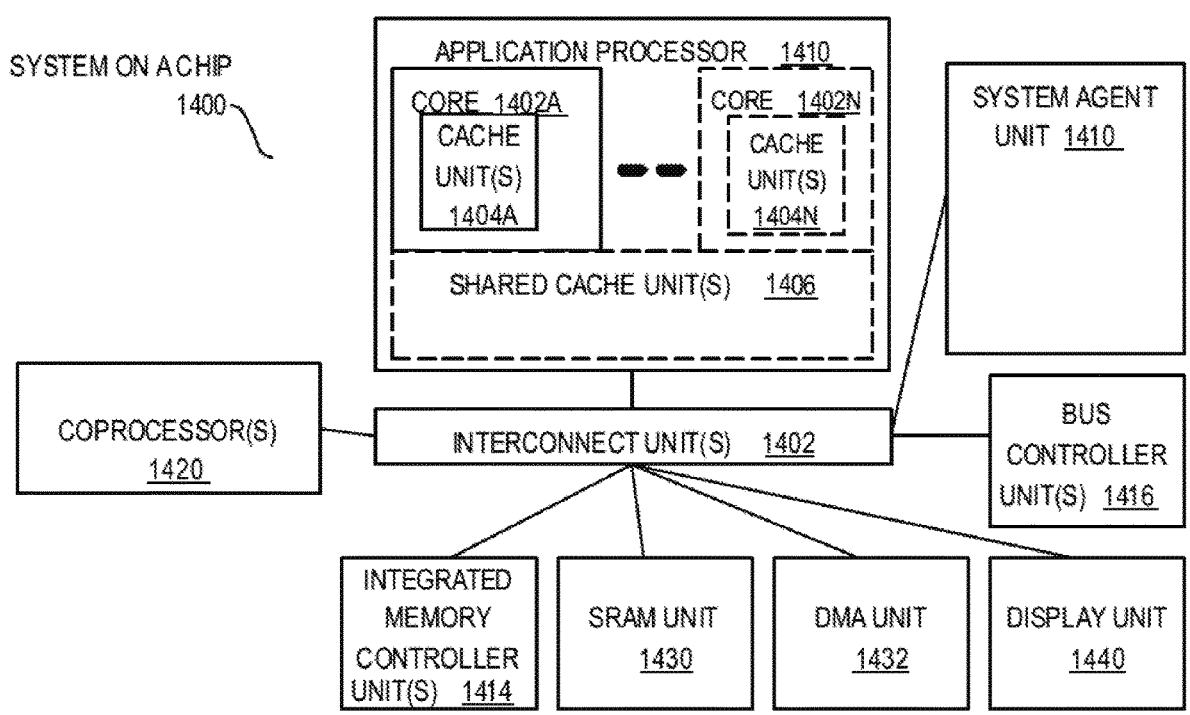
FIG. 14 is a block diagram of a system-on-chip (SoC), in accordance with an embodiment.

Referring now to FIG. 14, shown is a block diagram of a SoC 1400 in accordance with an embodiment of the present disclosure. Similar elements in FIG. 10 bear like reference numerals. Also, dashed lined boxes are optional features on more advanced SoCs. In FIG. 14, an interconnect unit(s) 1402 is coupled to: an application processor 1410 which includes a set of one or more cores 1002A-N, which include cache units 1004A-N, and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor. The program code may be implemented in a high level procedural or object-oriented programming language to communicate with a processing system. The program code may also be implemented in assembly or machine language. In fact, the mechanisms described herein are not limited in scope to any particular programming language. In any case, the language may be a compiled or interpreted language. One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions. Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

The methods and devices of this disclosure may be incorporated into any suitable circuit. For example, the methods and devices may be incorporated into numerous types of devices such as microprocessors, memory devices, interface controllers, or other integrated circuits. Implementations may be incorporated in the form software, soft logic implemented in a programmable logic device (PLD) or field-programmable gate array (FPGA), hard-logic implemented in a PLD or FPGA, or application-specific integrated circuit (ASIC). Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. Error correction code (ECC) circuitry comprising:
   encoder circuitry that receives a word and generates a first codeword of an error correction code (ECC) comprising codewords with N data bits and M parity bits, wherein the encoder circuitry comprises logic circuitry that generates parity bits from the word based on a parity generating operator $P_G$ associated with the ECC; and
   decoder circuitry that receives a second codeword of the ECC and generates a syndrome vector, wherein the decoder circuitry comprises logic circuitry that implements a parity-checking operator logic H, the parity-checking operator logic H comprising a D-matrix logic segment comprising logic circuitry that implements N columns associated with a data portion of the second codeword, wherein N is greater than one, and a P-matrix logic segment comprising logic circuitry that implements M columns associated with a parity portion of the second codeword, and wherein the D-matrix logic segment is configured to implement N−1 odd-weight columns and 1 even-weight column.

2. The ECC circuitry of claim 1, wherein N is 128 and M is 8.

3. The ECC circuitry of claim 1, wherein the decoder circuitry comprises an error correction logic circuitry that corrects a word portion of the second codeword based on the syndrome vector.

4. The ECC circuitry of claim 1, wherein the ECC comprises a single error correction (SEC) code.

5. The ECC circuitry of claim 4, wherein the SEC code is not a double error detection (DED) code, and wherein the SEC code is a reduced aliasing code.

6. The ECC circuitry of claim 1, wherein the encoder circuitry comprises $P_G$ logic circuitry that implements the parity generating operator $P_G$, and wherein the decoder circuitry is configured to receive:
   an output column of the $P_G$ logic circuitry to implement the D-matrix logic segment of the parity-checking operator logic H; and
   M−1 output columns of the $P_G$ logic circuitry to implement the P-matrix logic segment of the parity-checking operator logic H.

7. The ECC circuitry of claim 6, wherein the decoder circuitry comprises concatenating circuitry that concatenates the output columns of the $P_G$ logic circuitry associated with the parity bits and provides the concatenated output to a logic circuitry that implements the P-matrix logic segment of the parity-checking operator logic H to produce the syndrome vector.

8. The ECC circuitry of claim 1, comprising hardened logic that comprises the encoder circuitry and the decoder circuitry.

9. An electronic system comprising:
   error correction code (ECC) circuitry comprising a decoder that comprises:
      syndrome calculation circuitry that receives a codeword of an error correction code (ECC) and generates a syndrome vector corresponding to the codeword, the syndrome calculation circuitry comprises logic circuitry comprising a D segment logic circuitry and a P segment logic circuitry, wherein:
         the D segment logic circuitry implements N data portion columns of H-matrix logic circuitry associated with the ECC, wherein the N data portion columns comprise at least one even-weight column; and the P segment logic circuitry implements M parity portion columns of the H-matrix logic circuitry; and error correction circuitry configured to correct an error in the codeword indicated by the syndrome vector.

10. The electronic system of claim 9, wherein N data portion columns implemented by the D segment logic circuitry comprises only one even-weight column.

11. The electronic system of claim 9, wherein the at least one even-weight column in the N data portion columns implemented by the D segment logic circuitry is implemented by swapping at least one of the M parity portion columns with N data portion columns.

12. The electronic system of claim 9, wherein N is 128 and M is 8.

13. The electronic system of claim 9, wherein the ECC circuitry is disposed in a memory device of the electronic system.

14. The electronic system of claim 13, wherein the memory device comprises a double data rate synchronous dynamic random-access memory device (DDR SDRAM), a low power DDR SDRAM (LPDDR SDRAM) device, or a graphics DDR SDRAM (GDDR SDRAM) device.

15. The electronic system of claim 9, wherein the ECC circuitry is disposed in a processor or a co-processor of the electronic system.

16. The electronic system of claim 9, wherein the ECC circuitry comprises an encoder that generates codewords of the ECC.

17. A method, comprising:
generating parity bits from a word using a parity generating logic circuitry, wherein the parity generating logic circuitry implements a $P_G$ operator associated with a reduced aliasing error correcting code (ECC), wherein each codeword of the reduced aliasing ECC comprises N data bits and P parity bits, and wherein the reduced aliasing ECC is associated with a syndrome calculating operator H matrix that is implemented via logic circuitry and comprises a D segment logic circuitry associated with a data portion of the reduced aliasing ECC and a P segment logic circuitry associated with a parity portion of the reduced aliasing ECC, the D segment logic circuitry is configured to comprise one even-weight column and N−1 odd-weight columns;

concatenating the word with the parity bits to form a codeword of the reduced aliasing ECC; and storing the codeword in memory circuitry.

18. The method of claim 17, wherein the reduced alias ECC is a single error correction (SEC) code that minimizes alias errors caused by double bit-errors.

19. A method, comprising:
receiving a codeword from memory circuitry, wherein the codeword is from a reduced aliasing ECC and comprises N data bits and P parity bits; and generating a syndrome vector from the codeword using a syndrome generating logic circuitry comprising logic that implements an H matrix operator that comprises a D segment logic circuitry associated with a data portion of the reduced aliasing ECC and a P segment logic circuitry associated with a parity portion of the reduced aliasing ECC, the D segment logic is configured to comprise one even-weight column and N−1 odd-weight columns.

20. The method of claim 19, comprising correcting the codeword based on the syndrome by flipping a single bit of the codeword indicated by the syndrome.

* * * * *